(12) United States Patent
Nagano et al.

(10) Patent No.: US 7,227,410 B2
(45) Date of Patent: Jun. 5, 2007

(54) DIFFERENTIAL OUTPUT CIRCUIT WITH REDUCED DIFFERENTIAL OUTPUT VARIATION

(75) Inventors: Hideo Nagano, Hyogo (JP); Keisuke Aoyagi, Hyogo (JP); Masao Suzuki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 168 days.

(21) Appl. No.: 11/103,515

(22) Filed: Apr. 12, 2005

(65) Prior Publication Data

US 2005/0231282 A1   Oct. 20, 2005

(30) Foreign Application Priority Data

Apr. 14, 2004   (JP)   ............... 2004-119303

(51) Int. Cl.
*H03F 3/217*   (2006.01)
(52) U.S. Cl. ..................... 330/251; 330/259
(58) Field of Classification Search ........... 330/251, 330/259, 301
See application file for complete search history.

(56) References Cited

U.S. PATENT DOCUMENTS 5,977,796 A * 11/1999 Gabara ................. 326/86
2004/0124918 A1* 7/2004 Radelinow ............ 330/69

FOREIGN PATENT DOCUMENTS

JP   2000-134082   5/2000

* cited by examiner

*Primary Examiner*—Steven J. Mottola
(74) *Attorney, Agent, or Firm*—McDermott Will & Emery LLP (57) ABSTRACT

In a differential output circuit, a second amplifier has a positive terminal connected to a second fixed potential and a negative terminal to a fifth switch at a first terminal. First and second switches are connected at a point connected to the fifth switch at a second terminal and to a first load. Third and fourth switches are connected at a point connected to the fifth switch at a third terminal and to a second load. The second terminal is connected to the first terminal when the second and third switches turn on. The third terminal is connected to the first terminal when the first and fourth switches turn on.

4 Claims, 3 Drawing Sheets

DIFFERENTIAL OUTPUT CIRCUIT WITH REDUCED DIFFERENTIAL OUTPUT VARIATION

BACKGROUND OF THE INVENTION

1. Field of the Invention

The present invention relates differential output circuits and particularly to those with reduced differential output variation.

2. Description of the Background Art

Differential transmission circuits of the low voltage differential signaling (LVDS) standard characterized by high speed, low power consumption and low electro magnetic interference (EMI) are used for example for an interface circuit of a digital display that is required to transmit digital data of an image in large amount rapidly.

In a conventional differential output circuit a plurality of output circuits of an LVDS configuration have current adjusting MOSFETs added thereto, respectively, and one of them is used as a dummy output circuit having an output terminal connected to an end resistance to provide high and low levels which are compared with reference output high and low levels, respectively, to provide a desired output level, and to do so, a signal is generated to control the current adjusting MOSFET corresponding to the dummy output circuit and the signal is applied to the other output circuits' current adjusting MOSFETs to automatically adjustment a current (see Japanese Patent Laying-Open No. 2000-134082 for example).

Such configuration allows a differential output circuit having an output circuit capable of steadily producing a low amplitude signal.

As described in the Japanese Patent Laying-Open No. 2000-134082, however, the differential output circuit requires current adjusting MOSFETs and a control signal generation circuit and is also disadvantageous in that one of the plurality of differential output circuits that is used as a dummy output circuit contributes to a complicated circuit configuration.

SUMMARY OF THE INVENTION

The present invention contemplates a differential output circuit that can provide a differential output reduced in variation and also provide a simplified circuit configuration.

The present invention in one aspect provides a differential output circuit including first and second MOS transistors, first and second amplifiers, first and second loads, and first, second, third, fourth and fifth switches. The first MOS transistor has a gate connected to an output of the first amplifier, and a drain to the second and fourth switches. The first amplifier has a negative terminal connected to a first fixed potential, and a positive terminal to the first and second loads. The second MOS transistor has a gate connected to an output of the second amplifier, and a drain to the first and third switches. The second amplifier has a positive terminal connected to a second fixed potential, and a negative terminal to the fifth switch at a first terminal. The first and second switches are connected to a first node connected to the fifth switch at a second terminal and to the first load. The third and fourth switches are connected to a second node connected to the fifth switch at a third terminal and to the second load. The fifth switch has the second terminal connected to the first terminal when the second and third switches turn on. The fifth switch has the third terminal connected to the first terminal when the first and fourth switches turn on.

A differential output with reduced variation and a simplified circuit configuration can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
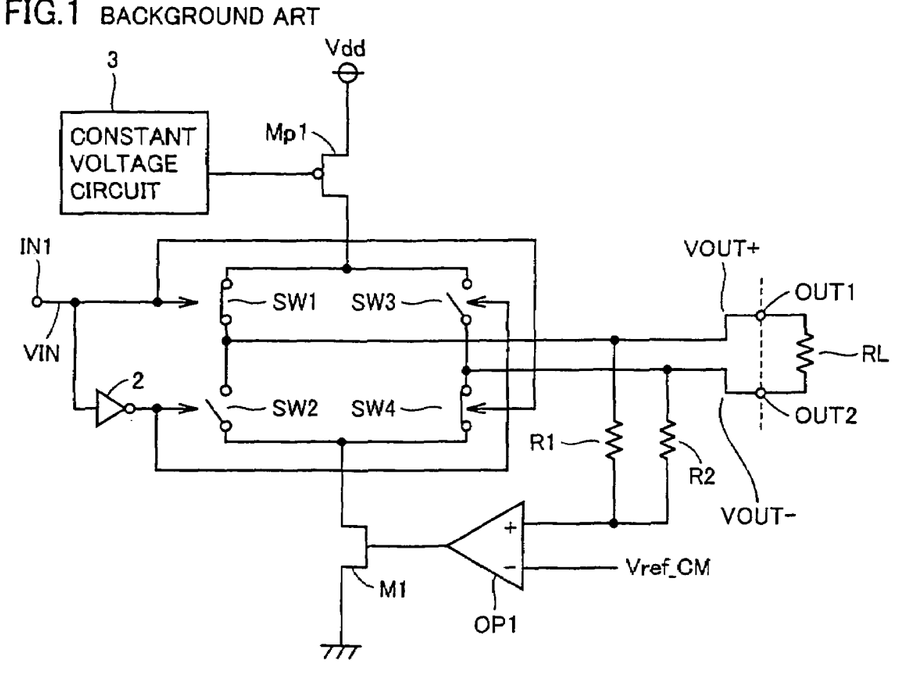
FIG. 1 shows a configuration of a differential output circuit assumed to be conventionally used.

Initially for comparison with the present differential output circuit a differential output circuit assumed to be conventionally used will be described with reference to a drawing.

Configuration

FIG. 1 shows a configuration of a differential output circuit assumed to be conventionally used. With reference to the figure, this differential output circuit includes an n channel MOS transistor M1, a p channel MOS transistor Mp1, switches SW1–SW4, an operational amplifier OP1, loads R1 and R2, an external load RL, an inverter circuit 2, and a constant voltage circuit 3.

N channel MOS transistor M1 has a gate connected to an output of operational amplifier OP1, a source to a third fixed potential (a ground potential), and a drain to switches SW2 and SW4.

P channel MOS transistor Mp1 has a gate connected to constant voltage circuit 3, a source to a fourth fixed potential Vdd, and a drain to switches SW1 and SW3.

Switches SW1 and SW2 are connected at a point (or a first node) connected to load R1 and an output terminal OUT1.

Switches SW3 and SW4 are connected at a point (or a second node) connected to load R2 and an output terminal OUT2.

Operational amplifier OP1 has a positive terminal connected to loads R1 and R2.

Output terminal OUT1 receives an output voltage VOUT+ and output terminal OUT2 receives an output voltage VOUT−.

External load RL is a load for the differential output circuit. External load RL is arranged at an external circuit receiving a signal from the differential output circuit and has one and the other sides connected to output terminals OUT1 and OUT2, respectively, and receives at opposite ends the voltages corresponding to output voltages VOUT+ and VOUT− (hereinafter generally referred to as "differential output").

An input terminal IN1 receives an input signal VIN. If a logic to be transmitted is high, input signal VIN attains a level corresponding to the fourth fixed potential Vdd (hereinafter referred to as "the high level"). If a logic to be transmitted is low, input signal VIN attains a level corresponding to the third fixed potential (the ground potential) (hereinafter referred to as "the low level").

If inverter circuit 2 receives signal VIN having the high level the circuit outputs a signal of the low level. If inverter circuit 2 receives signal VIN having the low level the circuit outputs a signal of the high level.

Switches SW1 and SW4 are connected to input signal VIN and for input signal VIN having the high level turn on and for input signal VIN having the low level turn off.

Switches SW2 and SW3 are connected to an output of inverter circuit 2 and for the input signal VIN having the low level turn on and for input signal VIN having the high level turn off.

Constant voltage circuit 3 supplies p channel MOS transistor Mp1 at the gate with a constant voltage so that the transistor's drain current has a constant value.

Loads R1 and R2 are provided to supply operational amplifier OP1 at a positive terminal with a voltage intermediate between output voltages VOUT+ and VOUT– and sufficiently high in impedance relative to external load RL. As such, the p channel MOS transistor Mp1 drain current hardly flows to loads R1 and R2.

Operational amplifier OP1 has positive and negative terminals receiving the voltage intermediate between output voltages VOUT+ and VOUT–, and a desired intermediate voltage Vref_CM (or a first fixed potential), respectively. When the positive and negative terminals receive equal voltages operational amplifier OP1 outputs a positive voltage. When the positive terminal receives a voltage larger than the negative terminal operational amplifier OP1 outputs an increased voltage. When the positive terminal receives a voltage smaller than the negative terminal, operational amplifier OP1 outputs a reduced voltage.

N channel MOS transistor M1 is sufficiently driven to pass increased current if the p channel MOS transistor Mp1 drain current is increased.

Furthermore, n channel MOS transistor M1 operates in a linear region, and when its gate-source voltage is increased its drain-source resistance is reduced and when its gate-source voltage is reduced its drain-source resistance is increased, and for either case it is sufficiently driven to pass the p channel MOS transistor Mp1 drain current.

As such, external load RL passes a current which is not limited by the drain current of n channel MOS transistor M1 but determined by that of p channel MOS transistor Mp1.

P channel MOS transistor Mp1 operates in saturation region.

The LVDS standard requires that at external load RL a voltage drop fall within a prescribed range, i.e., a differential output have an amplitude within a prescribed range and provide an intermediate voltage within a prescribed range.

Operation

The differential output circuit operates, as will be described hereinafter.

Input terminal IN1 receives input signal VIN. If input signal VIN has the high level, switches SW1 and SW4 turn on and switches SW2 and SW3 turn off. Accordingly, a current flows in a direction from output terminal OUT1 toward output terminal OUT2, and output voltage VOUT+ becomes higher in voltage and output voltage VOUT– becomes lower in voltage. (Hereinafter, of output voltages VOUT+ and VOUT–, the lower one will be referred to as the lower output voltage and the higher one will be referred to as the higher output voltage.

If input signal VIN has the low level, switches SW1 and SW4 turn off and switches SW2 and SW3 turn on. Accordingly, a current flows in a direction from output terminal OUT2 toward output terminal OUT1, and output voltage VOUT+ is the lower output voltage and output voltage VOUT– is the higher output voltage.

More specifically, if input signal VIN has the high level, then, as has been described above, output voltage VOUT+ is the higher output voltage and output voltage VOUT– is the lower output voltage.

If the voltage intermediate between output voltages VOUT+ and VOUT– is a desired intermediate voltage Vref_CM (the first fixed potential) for the sake of illustration then the n channel MOS transistor M1 drain-source resistance and the p channel MOS transistor Mp1 drain current determine the n channel MOS transistor M1 drain-source voltage. The n channel MOS transistor M1 drain-source voltage and the p channel MOS transistor Mp1 drain current determine the n channel MS transistor M1 gate-source voltage and operational amplifier OP1 provides a feedback circuit.

When this differential output circuit is started, i.e., when the differential output circuit is supplied with each fixed potential and started to operate, operational amplifier OP1 provides a feedback operation, as will be described hereinafter. The following operation is an operation instantly performed when the differential output circuit is started, and in reality it is a gentle operation as operational amplifier OP1 responds slowly.

When the voltage intermediate between output voltages VOUT+ and VOUT– is smaller than the desired intermediate voltage Vref_CM (the first fixed potential) operational amplifier OP1 outputs reduced voltage. Accordingly, the n channel MOS transistor M1 drain-source resistance can increase, the n channel MOS transistor M1 drain-source voltage drop can increase, and the voltage intermediate between output voltages VOUT+ and VOUT– can be increased and thus adjusted to be the desired intermediate voltage Vref_CM (the first fixed potential).

When the voltage intermediate between output voltages VOUT+ and VOUT– is larger than the desired intermediate voltage Vref_CM (the first fixed potential) operational amplifier OP1 outputs increased voltage. Accordingly, the n channel MOS transistor M1 drain-source resistance can decrease, the n channel MOS transistor M1 drain-source voltage drop can decrease, and the voltage intermediate between output voltages VOUT+ and VOUT– can be decreased and thus adjusted to be the desired intermediate voltage Vref_CM (the first fixed potential).

Thus the differential output circuit assumed to be conventionally used allows a voltage intermediate between output voltages VOUT+ and VOUT– to be reduced in variation to achieve a desired value.

If temperature, variation in manufacture, and the like affect and thus cause to constant voltage circuit 3 to output a voltage varying and thus causing the p channel MOS transistor Mp1 drain current to vary from a desired current value, the differential output circuit operates, as will be described hereinafter.

If constant voltage circuit 3 outputs reduced voltage and the p channel MOS transistor Mp1 drain current increases to be larger than the desired current value, external load RL experiences a large voltage drop, i.e., a differential output increased in amplitude is provided. If constant voltage circuit 3 outputs increased voltage and the p channel MOS transistor Mp1 drain current decreases to be smaller than the desired current value, external load RL experiences a reduced voltage drop, i.e., a differential output reduced in amplitude is provided.

If the p channel MOS transistor Mp1 drain current increases, the voltage intermediate between output voltages VOUT+ and VOUT− nonetheless does not vary, and the transistor cannot operate to limit the differential output's variation in amplitude.

If input signal VIN has the low level, then, as has been described previously, output voltage VOUT+ is the lower output voltage and output voltage VOUT− is the higher output voltage.

For input signal VIN having the low level, external load RL simply passes a current in the opposite direction, and n and p channel MOS transistors M1 and Mp1 and operational amplifier OP1 operate similarly as has been described for input signal VIN having the high level.

Thus, the differential output circuit assumed to be conventionally used cannot decrease its output's variation caused as temperature, variation in manufacture, and the like affect and thus cause constant voltage circuit 3 to output a voltage varying and thus causing the p channel MOS transistor Mp1 drain current, i.e., a current flowing through external load RL, to vary from a desired current value.

Hereinafter the present invention in embodiments will be described with reference to the drawings.

First Embodiment

Figure 2:
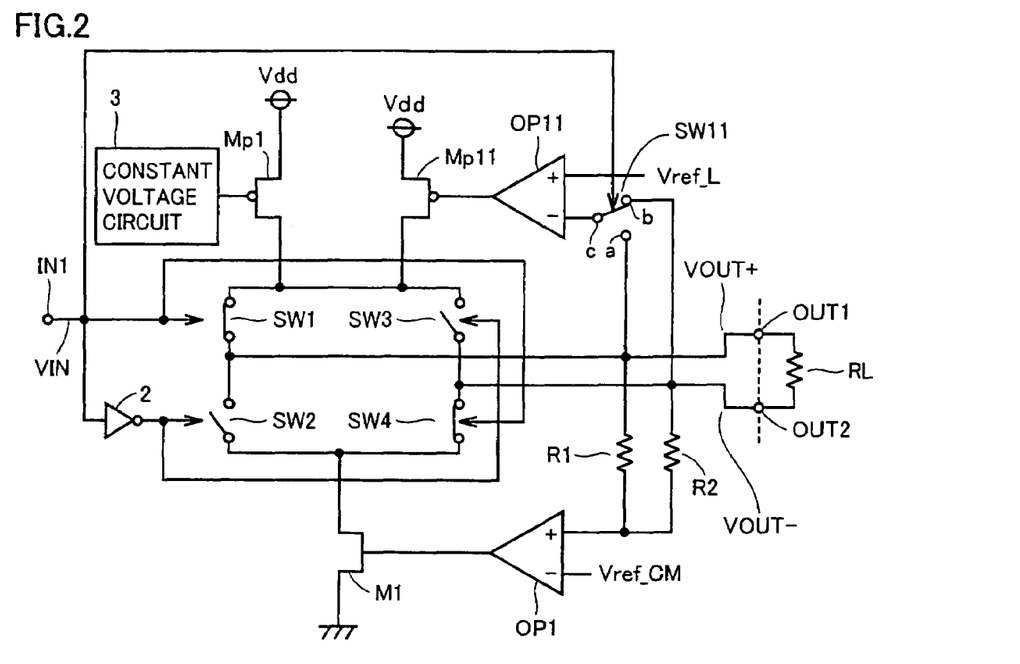
FIGS. 2–5 show configurations of the present differential output circuit in first to fourth embodiments, respectively.

The present embodiment relates to a differential output circuit assumed to be conventionally used that includes means for detecting in level the lower one of output voltages VOUT+ and VOUT−.

Configuration

FIG. 2 shows a configuration of the present differential output circuit in a first embodiment. With reference to the figure, this differential output circuit corresponds to the FIG. 1 differential output circuit plus an operational amplifier OP11, a switch SW11 and a p channel MOS transistor Mp11.

P channel MOS transistor Mp11 has a gate connected to operational amplifier OP11 at an output, a source to fourth fixed potential Vdd, a drain to switches SW1 and SW3 and the p channel MOS transistor Mp1 drain.

Switch SW11 has a terminal a connected to switches SW1 and SW2, load R1 and output terminal OUT1, a terminal b to switches SW3 and SW4, load R2 and output terminal OUT2, and a terminal c to operational amplifier OP11 at a negative terminal.

Switch SW11 is connected to input terminal IN1. For input signal VIN having the high level, terminals b and c are electrically connected while terminals a and c are electrically disconnected. For input signal VIN having the low level, terminal a and c are electrically connected while terminals b and c are electrically disconnected.

Operational amplifier OP11 at the negative terminal receives either output voltage VOUT+ or output voltage VOUT− and at a positive terminal receives a desired lower output voltage Vref_L (a second fixed potential A).

When the positive and negative terminals receive equal voltages operational amplifier OP11 outputs a positive voltage. When the positive terminal receives a voltage larger than the negative terminal operational amplifier OP11 outputs an increased voltage. When the positive terminal receives a voltage smaller than the negative terminal, operational amplifier OP11 outputs a reduced voltage.

Thus in operational amplifier OP11 if the lower output voltage is equal to the desired lower output voltage Vref_L (the second fixed potential A) and a steady differential output is thus provided, p channel MOS transistor Mp11 passes a constant drain current, and in accordance with which of the lower output voltage and the desired lower output voltage Vref_L (the second fixed potential A) is larger or smaller in magnitude, the p channel MOS transistor Mp11 drain current can be increased/decreased.

N channel MOS transistor M1 is sufficiently driven to pass increased current if the p channel MOS transistors Mp1 and Mp11 drain currents have increased.

Furthermore, n channel MOS transistor M1 operates in a linear region, and when its gate-source voltage is increased its drain-source resistance is reduced and when its gate-source voltage is reduced its drain-source resistance is increased, and for either case it is sufficiently driven to pass the p channel MOS transistors Mp1 and Mp11 drain currents.

As such, external load RL passes a current which is not limited by the n channel MOS transistor M1 drain current but is determined by the p channel MOS transistors Mp1 and Mp11 drain currents.

P channel MOS transistor Mp11 operates in saturation region.

The remainder in configuration is similar to the FIG. 1 differential output circuit.

Operation

The present embodiment's differential output circuit operates, as will be described hereinafter.

This differential output circuit corresponds to the FIG. 1 differential output circuit plus a control circuit added by operational amplifier OP11 and the remainder in operation is similar to the FIG. 1 differential output circuit.

Initially for input signal VIN having the high level, as has been described above, output voltage VOUT+ is the higher output voltage and output voltage VOUT− is the lower output voltage. Furthermore, switch SW11 has terminals b and c electrically connected and terminals a and c electrically disconnected. In other words, the lower output voltage or output voltage VOUT− is input to operational amplifier OP11 at the negative terminal.

When this differential output circuit is started, operational amplifier OP1 provides a feedback operation and operational amplifier OP11 provides a feedback operation, as will be described hereinafter. This is an operation instantly performed when the differential output circuit is started, and in reality it is a gentle operation as operational amplifiers OP1 and OP11 respond slowly.

Operational amplifier OP11 adjusts the p channel MOS transistor Mp11 drain current to allow output voltage VOUT− to achieve the desired lower output voltage Vref_L (the second fixed potential A).

If output voltage VOUT− is larger than the desired lower output voltage Vref_L (the second fixed potential A) operational amplifier OP11 performs a feedback operation. More specifically, operational amplifier OP11 outputs reduced voltage and the p channel MOS transistor Mp11 drain current increases. Accordingly, external load RL passes an increased current and output voltage VOUT− decreases so that the output voltage can be adjusted to the desired lower output voltage Vref_L (the second fixed potential A).

If output voltage VOUT− is smaller than the desired lower output voltage Vref_L (the second fixed potential A) operational amplifier OP11 performs a feedback operation. More specifically, operational amplifier OP11 outputs increased voltage and the p channel MOS transistor Mp11 drain current decreases. Accordingly, external load RL passes a reduced current and output voltage VOUT− increases so that the output voltage can be adjusted to the desired lower output voltage Vref_L (the second fixed potential A).

Operational amplifier OP1 provides a feedback operation similar to that provided in the FIG. 1 differential output circuit.

Thus the differential output circuit can set a differential output's intermediate voltage to the desired intermediate voltage Vref_CM (the first fixed potential) and the differential output's lower output voltage to the desired lower output voltage Vref_L (the second fixed potential A).

Note that the intermediate voltage is a voltage intermediate between the differential output circuit's lower and higher output voltages, and if a desired intermediate voltage and a desired lower output voltage or a desired higher output voltage can be obtained, the intermediate voltage can obtain a desired amplitude.

If temperature, variation in manufacture, and the like affect and thus cause constant voltage circuit 3 to output a voltage varying and thus causing the p channel MOS transistor Mp1 drain current to vary from a desired current value, the differential output circuit operates, as will be described hereinafter.

If constant voltage circuit 3 outputs increased voltage and the p channel MOS transistor Mp1 drain current is reduced to be smaller than the desired current value, external load RL passes a reduced current and a differential output reduced in amplitude is provided. Furthermore, output voltage VOUT− increases.

When output voltage VOUT− increases to be larger than the desired lower output voltage Vref_L (the second fixed potential A), then, as has been described previously, operational amplifier OP11 provides a feedback operation. The p channel MOS transistor Mp11 drain current increases, external load RL passes an increased current, and a differential output increased in amplitude is provided. Furthermore, output voltage VOUT− decreases, and the output voltage can be adjusted to be the desired lower output voltage Vref_L (the second fixed potential A).

If constant voltage circuit 3 outputs decreased voltage and the p channel MOS transistor Mp1 drain current is increased to be larger than the desired current value, external load RL passes an increased current and a differential output increased in amplitude is provided. Furthermore, output voltage VOUT− decreases.

When output voltage VOUT− decreases to be smaller than the desired lower output voltage Vref_L (the second fixed potential A), then, as has been described previously, operational amplifier OP11 provides a feedback operation. The p channel MOS transistor Mp1 drain current decreases, external load RL passes an decreased current, and a differential output decreased in amplitude is provided. Furthermore, output voltage VOUT− increases, and the output voltage can be adjusted to be the desired lower output voltage Vref_L (the second fixed potential A).

If input signal VIN has the low level, then, as has been described previously, output voltage VOUT+ is the lower output voltage and output voltage VOUT− is the higher output voltage. Furthermore, terminal a and c are electrically connected while terminals b and c are electrically disconnected. In other words, the lower output voltage or output voltage VOUT+ is input to operational amplifier OP11 at the negative terminal.

For input signal VIN having the low level, external load RL simply passes a current in the opposite direction, and n channel MOS transistors M1, p channel MOS transistors M1 and Mp11, and operational amplifiers OP1 and OP11 operate similarly as has been described for input signal VIN having the high level.

The differential output circuit described in the Japanese Patent Laying-Open No. 2000-134082 provides a steady differential output by separately introducing a control circuit and a dummy circuit and thus provides to a complicated circuit configuration, whereas the present embodiment's differential output circuit can internally perform a feedback operation and thus provide a simplified circuit configuration.

Furthermore, the differential output circuit assumed to be conventionally used, as shown in FIG. 1, cannot decrease its output's variation in amplitude caused as temperature, variation in manufacture, and the like result in an external load passing a varying current, whereas the present embodiment's differential output circuit is driven by a difference between a lower output voltage and a desired lower output voltage value to increase/decrease a current flowing through external load RL. The desired lower output voltage value can constantly be obtained and a differential output having an amplitude reduced in variation can be provided. Fast as well as long-distance transmission can thus be achieved.

Furthermore in the present embodiment's differential output circuit switch SW11 can be switched so that whether input signal VIN may be logically high or low, operational amplifier OP11 can be supplied with the lower output voltage to constantly limit a differential output in variation to achieve first as well as long-distance transmission.

Second Embodiment

Figure 3:
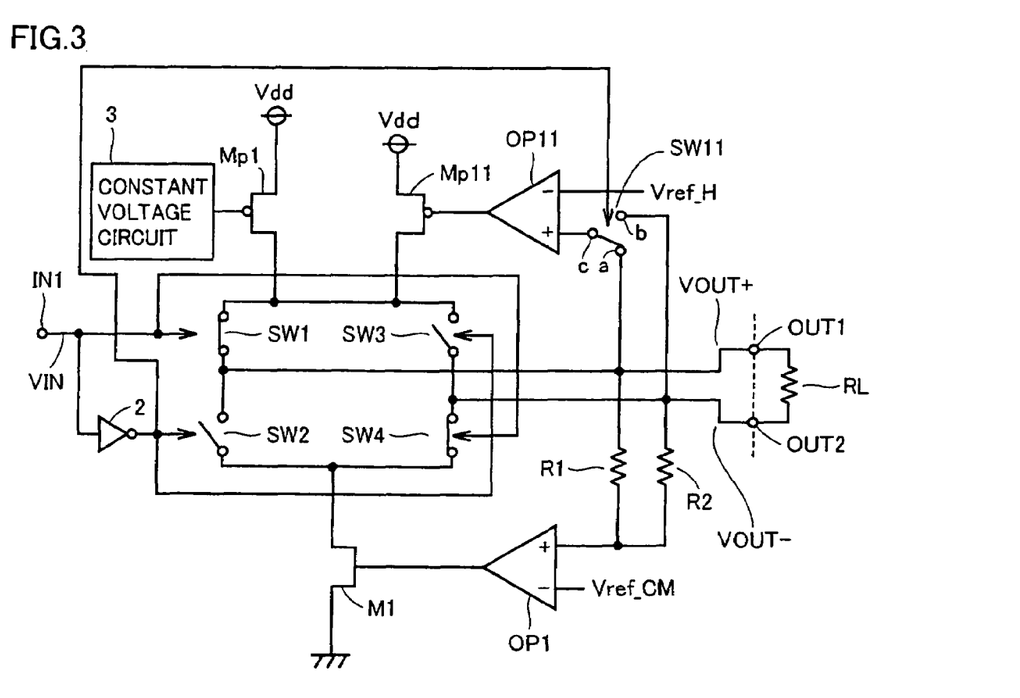

The present embodiment relates to the first embodiment's differential output circuit that includes means for detecting in level the higher one of output voltages VOUT+ and VOUT−.

Configuration

FIG. 3 shows the present differential output circuit in a second embodiment. With reference to the figure, this differential output circuit differs from that of the first embodiment in that operational amplifier OP11 has a negative terminal receiving a desired higher output voltage Vref_H (a second fixed potential B).

Switch SW11 is connected to inverter circuit 2 at an output and for input signal VIN having the low level terminals b and c are electrically connected and terminals a and c are electrically disconnected and for input signal VIN having the high level terminals a and c are electrically connected and terminals b and c are electrically disconnected.

Operational amplifier OP11 has a positive terminal receiving output voltage VOUT+ or VOUT− and a negative terminal receiving the desired higher output voltage Vref_H (the second fixed potential B). Furthermore, the voltages input to operational amplifier OP11 at the positive and negative terminals and that output therefrom have a relationship similar to that provided in the FIG. 2 differential output circuit by operational amplifier OP11.

Thus in operational amplifier OP11 if the higher output voltage is equal to the desired higher output voltage Vref_H (the second fixed potential B) and a steady differential output is thus provided, p channel MOS transistor Mp11 passes a constant drain current, and in accordance with which of the higher output voltage and the desired higher output voltage Vref_H (the second fixed potential B) is larger or smaller in magnitude, the p channel MOS transistor Mp11 drain current can be increased/decreased.

The remainder in configuration is similar to that of the differential output circuit of the first embodiment shown in FIG. 1.

Operation

The present embodiment's differential output circuit operates as described hereinafter.

This differential output circuit, as well as the first embodiment, corresponds to the FIG. 1 differential output circuit plus a control circuit by operational amplifier OP11. The remainder in operation is similar to that of the FIG. 1 differential output circuit.

Initially, if input signal VIN has the high level, as has been described previously, output voltage VOUT+ is the higher output voltage and output voltage VOUT− is the lower output voltage. Furthermore, switch SW11 has terminals a and c electrically connected and terminals b and c electrically disconnected. In other words, the higher output voltage or output voltage VOUT+ is input to operational amplifier OP11 at the negative terminal.

When this differential output circuit is started, operational amplifier OP11 provides a feedback operation, as will be described hereinafter. This is an operation instantly performed when the differential output circuit is started, and in reality it is a gentle operation as operational amplifier OP11 responds slowly.

Operational amplifier OP11 adjusts the p channel MOS transistor Mp11 drain current to allow output voltage VOUT+ to achieve the desired higher output voltage Vref_H (the second fixed potential B).

If output voltage VOUT+ is larger than the desired higher output voltage Vref_H (the second fixed potential B) operational amplifier OP11 performs a feedback operation. More specifically, operational amplifier OP11 outputs increased voltage and the p channel MOS transistor Mp11 drain current decreases. Accordingly, external load RL passes an decreased current and output voltage VOUT+ decreases so that the output voltage can be adjusted to the desired higher output voltage Vref_H (the second fixed potential B).

If output voltage VOUT+ is smaller than the desired higher output voltage Vref_H (the second fixed potential B) operational amplifier OP11 performs a feedback operation. More specifically, operational amplifier OP11 outputs decreased voltage and the p channel MOS transistor Mp11 drain current increases. Accordingly, external load RL passes an increased current and output voltage VOUT+ increases so that the output voltage can be adjusted to the desired higher output voltage Vref_H (the second fixed potential B).

Operational amplifier OP1 provides a feedback operation similar to that provided in the FIG. 2 first embodiment's differential output circuit.

Thus the differential output circuit can set a differential output's intermediate voltage to the desired intermediate voltage Vref_CM (the first fixed potential) and the differential output's higher output voltage to the desired higher output voltage Vref_H (the second fixed potential B).

Note that the intermediate voltage is a voltage intermediate between the differential output circuit's lower and higher output voltages, and if a desired intermediate voltage and a desired lower output voltage or a desired higher output voltage can be obtained, the intermediate voltage can obtain a desired amplitude.

If temperature, variation in manufacture, and the like affect and thus cause constant voltage circuit 3 to output a voltage varying and thus causing the p channel MOS transistor Mp1 drain current to vary from a desired current value, the differential output circuit operates, as will be described hereinafter.

If constant voltage circuit 3 outputs increased voltage and the p channel MOS transistor Mp1 drain current is reduced to be smaller than the desired current value, external load RL passes a reduced current and a differential output reduced in amplitude is provided. Furthermore, output voltage VOUT+ decreases.

When output voltage VOUT+ decreases to be smaller than the desired higher output voltage Vref_H (the second fixed potential B), then, as has been described previously, operational amplifier OP11 provides a feedback operation. The p channel MOS transistor Mp11 drain current increases, external load RL passes an increased current, and a differential output increased in amplitude is provided. Furthermore, output voltage VOUT+ increases, and the output voltage can be adjusted to be the desired higher output voltage Vref_H (the second fixed potential B).

If constant voltage circuit 3 outputs decreased voltage and the p channel MOS transistor Mp1 drain current is increased to be larger than the desired current value, external load RL passes an increased current and a differential output increased in amplitude is provided. Furthermore, output voltage VOUT+ increases.

When output voltage VOUT+ increases to be larger than the desired higher output voltage Vref_H (the second fixed potential B), then, as has been described previously, operational amplifier OP11 provides a feedback operation. The p channel MOS transistor Mp1 drain current decreases, external load RL passes a decreased current, and a differential output decreased in amplitude is provided. Furthermore, output voltage VOUT+ decreases, and the output voltage can be adjusted to be the desired higher output voltage Vref_H (the second fixed potential B).

If input signal VIN has the low level, then, as has been described previously, output voltage VOUT+ is the lower output voltage and output voltage VOUT− is the higher output voltage. Furthermore, terminal b and c are electrically connected while terminals a and c are electrically disconnected. In other words, the higher output voltage or output voltage VOUT− is input to operational amplifier OP11 at the positive terminal.

For input signal VIN having the low level, external load RL simply passes a current in the opposite direction, and n channel MOS transistors M1, p channel MOS transistors Mp1 and Mp11, and operational amplifiers OP1 and OP11 operate similarly as has been described for input signal VIN having the high level.

The differential output circuit described in the Japanese Patent Laying-Open No. 2000-134082 provides a steady differential output by separately introducing a control circuit and a dummy circuit and thus provides to a complicated circuit configuration, whereas the present embodiment's differential output circuit can internally perform a feedback operation and thus provide a simplified circuit configuration.

Furthermore, the differential output circuit assumed to be conventionally used, as shown in FIG. 1, cannot decrease its output's variation in amplitude caused as temperature, variation in manufacture, and the like result in an external load passing a varying current, whereas the present embodiment's differential output circuit is driven by a difference between a higher output voltage and a desired higher output voltage value to increase/decrease a current flowing through external load RL. The desired higher output voltage value can constantly be obtained and a differential output having an amplitude reduced in variation can be provided. Fast as well as long-distance transmission can thus be achieved.

Furthermore in the present embodiment's differential output circuit switch SW11 can be switched so that whether input signal VIN may be logically high or low, operational amplifier OP11 can be supplied with the higher output voltage to constantly limit a differential output in variation to achieve first as well as long-distance transmission.

Third Embodiment

Figure 4:
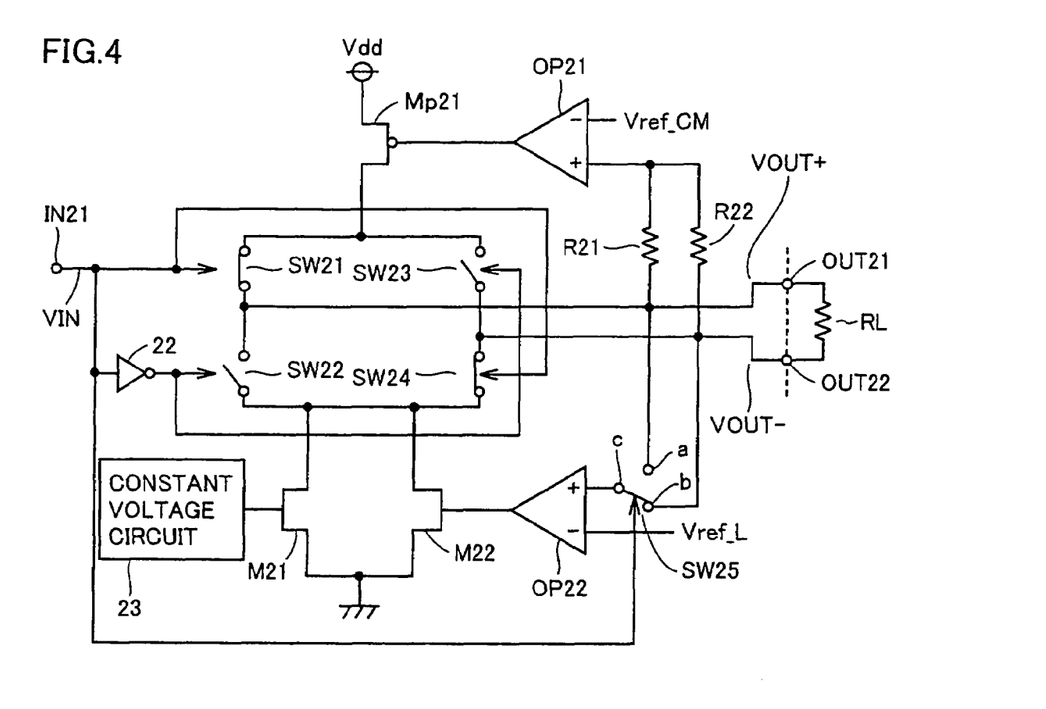

The present embodiment relates to a differential output circuit corresponding to that of the first embodiment shown in FIG. 2 with operational amplifiers OP11 and OP1 controlling the differential output's amplitude and intermediate voltage, respectively, positionally switched.

Configuration

FIG. 4 shows a configuration of the present differential output circuit in a third embodiment. With reference to the figure, this differential output circuit includes n channel MOS transistors M21 and M22, a p channel MOS transistor Mp21, switches SW21–SW25, operational amplifiers OP21 and OP22, loads R21 and R22, external load RL, an inverter circuit 22, and a constant voltage circuit 23.

P channel MOS transistor Mp21 has a gate connected to operational amplifier OP21 at an output, a source to the fourth fixed potential Vdd, and a drain to switches SW21 and SW23.

N channel MOS transistor M21 has a gate connected to constant voltage circuit 23, a source to the third fixed potential (the ground potential), and a drain to switches SW22 and SW24 and N channel MOS transistor M22 at the drain.

N channel MOS transistor M22 has a gate connected to operational amplifier OP22 at an output, a source to the third fixed potential (the ground potential), and a drain to switches SW22 and SW24 and N channel MOS transistor M21 at the drain.

Switches SW21 and SW22 are connected at a point (or a first node) connected to load R21 and an output terminal OUT21.

Switches SW23 and SW24 are connected at a point (or a second node) connected to load R22 and an output terminal OUT22.

Operational amplifier OP21 has a positive terminal connected to loads R21 and R22.

Output terminal OUT21 receives output voltage VOUT+ and output terminal OUT22 receives output voltage VOUT−.

External load RL is a load for the differential output circuit. External load RL is arranged at an external circuit receiving a signal from the differential output circuit and has one and the other sides connected to output terminals OUT21 and OUT22, respectively, and receives differential output at opposite ends.

Input terminal IN21 receives input signal VIN.

Inverter circuit 22 receives input signal VIN and performs an operation similar to that performed by inverter circuit 2 provided in the FIG. 1 differential output circuit.

Switches SW21 and SW24 are connected to input signal VIN and perform an operation similar to that performed in the FIG. 1 differential output circuit by switches SW1 and SW4.

Switches SW22 and SW23 are connected to inverter circuit 22 at an output and perform an operation similar to that performed in the FIG. 1 differential output circuit by switches SW1 and SW3.

Switch SW25 has a terminal a connected to switches SW21 and SW22, load R21 and output terminal OUT21, a terminal b to switches SW23 and SW24, load R22 and output terminal OUT22, and a terminal c to operational amplifier OP21 at a positive terminal.

Switch SW25 is connected to input terminal IN21 and performs an operation similar to that performed in the FIG. 2 first embodiment's differential output circuit by switch SW11.

Constant voltage circuit 23 supplies n channel MOS transistor M21 at the gate with a constant voltage so that the transistor's drain current has a constant value.

Loads R21 and R22 are provided to supply operational amplifier OP21 at a positive terminal with a voltage intermediate between output voltages VOUT+ and VOUT− and sufficiently high in impedance relative to external load RL. As such, the p channel MOS transistor Mp21 drain current hardly flows to loads R21 and R22.

Operational amplifier OP21 receives at the positive terminal a voltage intermediate between output voltages VOUT+ and VOUT− and at a negative terminal a desired intermediate voltage Vref_CM (or the first fixed potential). Furthermore, a voltages received by and output from operational amplifier OP21 have a relationship similar to that of voltages received by and output from operational amplifier OP1 of the FIG. 1 differential output circuit.

Operational amplifier OP22 receives output voltage VOUT+ or VOUT− at the positive terminal, and the desired lower output voltage Vref_L (the second fixed potential A) at a negative terminal. Furthermore, the voltages input to operational amplifier OP22 at the positive and negative terminals and that output therefrom have a relationship similar to that provided in the FIG. 2 first embodiment's differential output circuit by operational amplifier OP11.

Thus in operational amplifier OP22 if the lower output voltage is equal to the desired lower output voltage Vref_L (the second fixed potential A) and a steady differential output is thus provided, n channel MOS transistor M22 passes a constant drain current, and in accordance with which of the lower output voltage and the desired lower output voltage Vref_L (the second fixed potential A) is larger or smaller in magnitude, the n channel MOS transistor M22 drain current can be increased/decreased.

P channel MOS transistor Mp21 is sufficiently driven to pass increased drain currents of n channel MOS transistors M21 and M22, respectively.

Furthermore, p channel MOS transistor Mp21 operates in linear region, and when its gate-source voltage is increased its drain-source resistance increases and when its gate-source voltage is reduced its drain-source resistance decreases, and for either case it is sufficiently driven to pass the n channel MOS transistors M21 and M22 drain currents.

As such, external load RL passes a current which is not limited by the p channel MOS transistor Mp21 drain current but is determined by the n channel MOS transistors M21 and M22 drain currents.

N channel MOS transistors M21 and M22 operate in saturation region.

Operation

This differential output circuit operates as will be described hereinafter.

If voltage intermediate between output voltages VOUT+ and VOUT− is assumed to be the desired intermediate voltage Vref_CM (the first fixed potential) then the p channel MOS transistor Mp21 drain-source resistance and drain current determine the transistor's drain-source voltage. The p channel MOS transistor Mp21 drain-source voltage and drain current determine the transistor's gate-source voltage and operational amplifier OP21 provides a feedback circuit.

Initially for input signal VIN having the high level, as has been described above, output voltage VOUT+ is the higher output voltage and output voltage VOUT− is the lower output voltage. Furthermore, switch SW25 has terminals b and c electrically connected and terminals a and c electrically disconnected. In other words, the lower output voltage or output voltage VOUT– is input to operational amplifier OP22 at the positive terminal.

When this differential output circuit is started, operational amplifier OP21 provides a feedback operation and operational amplifier OP22 provides a feedback operation, as will be described hereinafter. This is an operation instantly performed when the differential output circuit is started, and in reality it is a gentle operation as operational amplifiers OP21 and OP22 respond slowly.

Operational amplifier OP22 adjusts the n channel MOS transistor M22 drain current to allow output voltage VOUT– to achieve the desired lower output voltage Vref_L (the second fixed potential A).

If output voltage VOUT– is larger than the desired lower output voltage Vref_L (the second fixed potential A) operational amplifier OP22 performs a feedback operation. More specifically, operational amplifier OP22 outputs increased voltage and the n channel MOS transistor M22 drain current increases. Accordingly, external load RL passes an increased current and output voltage VOUT– decreases so that the output voltage can be adjusted to the desired lower output voltage Vref_L (the second fixed potential A).

When the voltage intermediate between output voltages VOUT+ and VOUT– is smaller than the desired intermediate voltage Vref_CM (the first fixed potential) operational amplifier OP21 performs a feedback operation. More specifically, operational amplifier OP21 outputs reduced voltage. Accordingly, the p channel MOS transistor Mp21 drain-source resistance can be decreased, the p channel MOS transistor Mp21 drain-source voltage drop can be decreased, and the voltage intermediate between output voltages VOUT+ and VOUT– can be increased and thus adjusted to be the desired intermediate voltage Vref_CM (the first fixed potential).

If output voltage VOUT– is smaller than the desired lower output voltage Vref_L (the second fixed potential A) operational amplifier OP22 performs a feedback operation. More specifically, operational amplifier OP22 outputs reduced voltage and the n channel MOS transistor M22 drain current decreases. Accordingly, external load RL passes a reduced current and output voltage VOUT– increases so that the output voltage can be adjusted to the desired lower output voltage Vref_L (the second fixed potential A).

When the voltage intermediate between output voltages VOUT+ and VOUT– is larger than the desired intermediate voltage Vref_CM (the first fixed potential) operational amplifier OP21 performs a feedback operation. More specifically, operational amplifier OP21 outputs increased voltage. Accordingly, the p channel MOS transistor Mp21 drain-source resistance can be increased, the p channel MOS transistor Mp21 drain-source voltage drop can be increased, and the voltage intermediate between output voltages VOUT+ and VOUT– can be decreased and thus adjusted to be the desired intermediate voltage Vref_CM (the first fixed potential).

Thus the differential output circuit can set a differential output's intermediate voltage to the desired intermediate voltage Vref_CM (the first fixed potential) and the differential output's lower output voltage to the desired lower output voltage Vref_L (the second fixed potential A).

If temperature, variation in manufacture, and the like affect and thus cause to constant voltage circuit 23 to output a voltage varying and thus causing the n channel MOS transistor M21 drain current to vary from a desired current value, the differential output circuit operates, as will be described hereinafter.

If constant voltage circuit 23 outputs reduced voltage and the n channel MOS transistor M21 drain current is reduced to be smaller than the desired current value, external load RL passes a reduced current and a differential output reduced in amplitude is provided. Furthermore, output voltage VOUT– increases.

When output voltage VOUT– increases to be larger than the desired lower output voltage Vref_L (the second fixed potential A), then, as has been described previously, operational amplifier OP22 provides a feedback operation. The n channel MOS transistor M22 drain current increases, external load RL passes an increased current, and a differential output increased in amplitude is provided. Furthermore, output voltage VOUT– decreases, and the output voltage can be adjusted to be the desired lower output voltage Vref_L (the second fixed potential A).

If constant voltage circuit 23 outputs decreased voltage and the n channel MOS transistor M21 drain current is increased to be smaller than the desired current value, external load RL passes an increased current and a differential output increased in amplitude is provided. Furthermore, output voltage VOUT– decreases.

When output voltage VOUT– decreases to be smaller than the desired lower output voltage Vref_L (the second fixed potential A), then, as has been described previously, operational amplifier OP22 provides a feedback operation. The n channel MOS transistor M22 drain current decreases, external load RL passes a decreased current, and a differential output decreased in amplitude is provided. Furthermore, output voltage VOUT– increases, and the output voltage can be adjusted to be the desired lower output voltage Vref_L (the second fixed potential A).

If input signal VIN has the low level, then, as has been described previously, output voltage VOUT+ is the lower output voltage and output voltage VOUT– is the higher output voltage. Furthermore, terminal a and c are electrically connected while terminals b and c are electrically disconnected. In other words, the lower output voltage or output voltage VOUT+ is input to operational amplifier OP22 at the positive terminal.

For input signal VIN having the low level, external load RL simply passes a current in the opposite direction, and n channel MOS transistors M21 and M22, p channel MOS transistor Mp21, and operational amplifiers OP21 and OP22 operate similarly as has been described for input signal VIN having the high level.

The differential output circuit described in the Japanese Patent Laying-Open No. 2000-134082 provides a steady differential output by separately introducing a control circuit and a dummy circuit and thus provides to a complicated circuit configuration, whereas the present embodiment's differential output circuit can internally perform a feedback operation and thus provide a simplified circuit configuration.

Furthermore, the differential output circuit assumed to be conventionally used, as shown in FIG. 1, cannot decrease its output's variation in amplitude caused as temperature, variation in manufacture, and the like result in an external load passing a varying current, whereas the present embodiment's differential output circuit is driven by a difference between a lower output voltage and a desired lower output voltage value to increase/decrease a current flowing through external load RL. The desired lower output voltage value can constantly be obtained and a differential output having an amplitude reduced in variation can be provided. Fast as well as long-distance transmission can thus be achieved.

Furthermore in the present embodiment's differential output circuit switch SW25 can be switched so that whether input signal VIN may be logically high or low, operational amplifier OP22 can be supplied with the lower output voltage to constantly limit a differential output in variation to achieve first as well as long-distance transmission.

Fourth Embodiment

Figure 5:
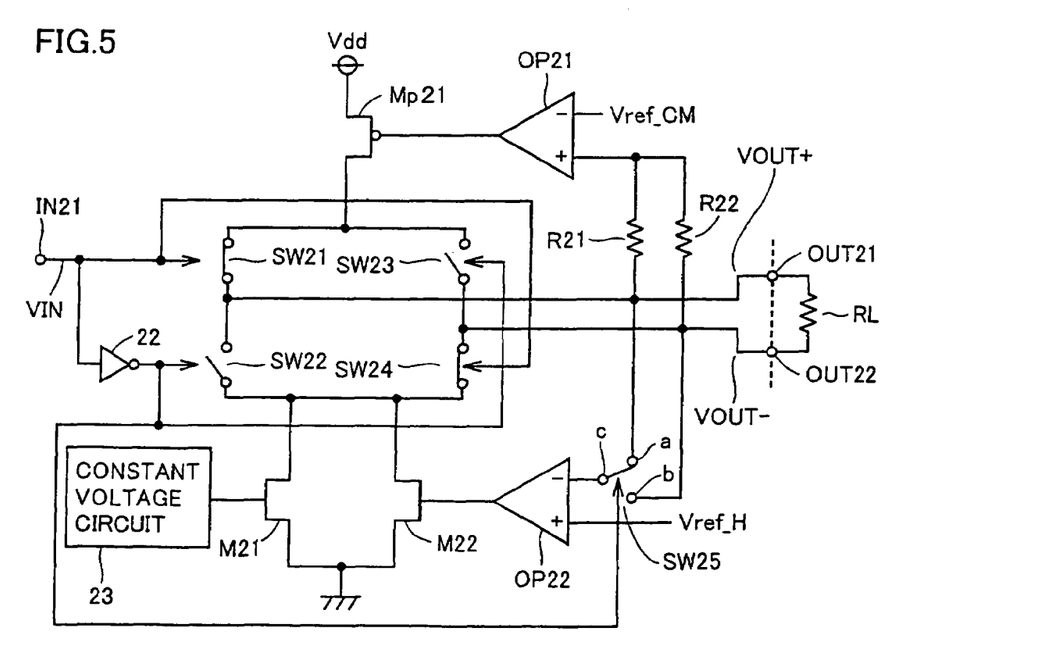

The present embodiment provides a differential output circuit corresponding to that of the third embodiment that includes means for detecting in level the higher one of output voltages VOUT+ and VOUT−.

Configuration

FIG. 5 shows the present differential output circuit in a fourth embodiment. With reference to the figure, this differential output circuit differs from that of the third embodiment in that operational amplifier OP22 has a positive terminal receiving a desired higher output voltage Vref_H (the second fixed potential B).

Switch SW25 is connected to inverter circuit 22 at an output and for input signal VIN having the low level has terminals b and c electrically connected and terminals a and c electrically disconnected and for input signal VIN having the high level has terminals a and c electrically connected and terminals b and c electrically disconnected.

Operational amplifier OP22 receives output voltage VOUT+ or VOUT− at a negative terminal and the desired higher output voltage Vref_H (the second fixed potential B) at the positive terminal. Furthermore, the voltages input to operational amplifier OP22 at the positive and negative terminals and that output therefrom have a relationship similar to that provided in the FIG. 2 first embodiment's differential output circuit by operational amplifier OP11.

Thus in operational amplifier OP22 if the higher output voltage is equal to the desired higher output voltage Vref_H (the second fixed potential B) and a steady differential output is thus provided, p channel MOS transistor M22 passes a constant drain current, and in accordance with which of the higher output voltage and the desired higher output voltage Vref_H (the second fixed potential B) is larger or smaller in magnitude, the n channel MOS transistor M22 drain current can be increased/decreased.

The remainder in configuration is similar to that of the differential output circuit of the third embodiment.

Operation

The present embodiment's differential output circuit operates as described hereinafter.

This differential output circuit is similar to that of the third embodiment shown in FIG. 4 except the feedback operation performed by operational amplifier OP22.

Initially, if input signal VIN has the high level, as has been described previously, output voltage VOUT+ is the higher output voltage and output voltage VOUT− is the lower output voltage. Furthermore, switch SW25 has terminals a and c electrically connected and terminals b and c electrically disconnected. In other words, the higher output voltage or output voltage VOUT+ is input to operational amplifier OP22 at the negative terminal.

When this differential output circuit is started, operational amplifier OP22 provides a feedback operation, as will be described hereinafter. This is an operation instantly performed when the differential output circuit is started, and in reality it is a gentle operation as operational amplifier OP22 responds slowly.

Operational amplifier OP22 adjusts the n channel MOS transistor M22 drain current to allow output voltage VOUT+ to achieve the desired higher output voltage Vref_H (the second fixed potential B).

If output voltage VOUT+ is larger than the desired higher output voltage Vref_H (the second fixed potential B) operational amplifier OP22 performs a feedback operation. More specifically, operational amplifier OP22 outputs decreased voltage and the n channel MOS transistor M22 drain current decreases. Accordingly, external load RL passes a decreased current and output voltage VOUT+ decreases so that the output voltage can be adjusted to the desired higher output voltage Vref_H (the second fixed potential B).

If output voltage VOUT+ is smaller than the desired higher output voltage Vref_H (the second fixed potential B) operational amplifier OP22 performs a feedback operation. More specifically, operational amplifier OP22 outputs increased voltage and the n channel MOS transistor M22 drain current increases. Accordingly, external load RL passes an increased current and output voltage VOUT+ increases so that the output voltage can be adjusted to the desired higher output voltage Vref_H (the second fixed potential B).

Operational amplifier OP21 provides a feedback operation similar to that provided in the FIG. 2 third embodiment's differential output circuit.

Thus the differential output circuit can set a differential output's intermediate voltage to the desired intermediate voltage Vref_CM (the first fixed potential) and the differential output's higher output voltage to the desired higher output voltage Vref_H (the second fixed potential B).

If temperature, variation in manufacture, and the like affect and thus cause constant voltage circuit 3 to output a voltage varying and thus causing the n channel MOS transistor M21 drain current to vary from a desired current value, the differential output circuit operates, as will be described hereinafter.

If constant voltage circuit 3 outputs decreased voltage and the n channel MOS transistor M21 drain current is reduced to be smaller than the desired current value, external load RL passes a reduced current and a differential output reduced in amplitude is provided. Furthermore, output voltage VOUT+ decreases.

When output voltage VOUT+ decreases to be smaller than the desired higher output voltage Vref_H (the second fixed potential B), then, as has been described previously, operational amplifier OP11 provides a feedback operation. The n channel MOS transistor M22 drain current increases, external load RL passes an increased current, and a differential output increased in amplitude is provided. Furthermore, output voltage VOUT+ increases, and the output voltage can be adjusted to be the desired higher output voltage Vref_H (the second fixed potential B).

If constant voltage circuit 3 outputs increased voltage and the n channel MOS transistor M21 drain current is increased to be larger than the desired current value, external load RL passes an increased current and a differential output increased in amplitude is provided. Furthermore, output voltage VOUT+ increases.

When output voltage VOUT+ increases to be larger than the desired higher output voltage Vref_H (the second fixed potential B), then, as has been described previously, operational amplifier OP11 provides a feedback operation. The n channel MOS transistor M22 drain current decreases, external load RL passes a decreased current, and a differential output decreased in amplitude is provided. Furthermore, output voltage VOUT+ decreases, and the output voltage can be adjusted to be the desired higher output voltage Vref_H (the second fixed potential B).

If input signal VIN has the low level, then, as has been described previously, output voltage VOUT+ is the lower output voltage and output voltage VOUT− is the higher output voltage. Furthermore, terminal b and c are electrically connected while terminals a and c are electrically disconnected. In other words, the higher output voltage or output voltage VOUT− is input to operational amplifier OP22 at the negative terminal.

For input signal VIN having the low level, external load RL simply passes a current in the opposite direction, and n channel MOS transistors M21 and M22, p channel MOS transistor Mp21, and operational amplifiers OP21 and OP22 operate similarly as has been described for input signal VIN having the high level.

The differential output circuit described in the Japanese Patent Laying-Open No. 2000-134082 provides a steady differential output by separately introducing a control circuit and a dummy circuit and thus provides to a complicated circuit configuration, whereas the present embodiment's differential output circuit can internally perform a feedback operation and thus provide a simplified circuit configuration.

Furthermore, the differential output circuit assumed to be conventionally used, as shown in FIG. 1, cannot decrease its output's variation in amplitude caused as temperature, variation in manufacture, and the like result in an external load passing a varying current, whereas the present embodiment's differential output circuit is driven by a difference between a higher output voltage and a desired higher output voltage value to increase/decrease a current flowing through external load RL. The desired higher output voltage value can constantly be obtained and a differential output having an amplitude reduced in variation can be provided. Fast as well as long-distance transmission can thus be achieved.

Furthermore in the present embodiment's differential output circuit switch SW25 can be switched so that whether input signal VIN may be logically high or low, operational amplifier OP22 can be supplied with the higher output voltage to constantly limit a differential output in variation to achieve first as well as long-distance transmission.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A differential output circuit comprising first and second MOS transistors, first and second amplifiers, first and second loads, and first, second, third, fourth and fifth switches, wherein:
    said first MOS transistor has a gate connected to an output of said first amplifier, and a drain to said second and fourth switches;
    said first amplifier has a negative terminal connected to a first fixed potential, and a positive terminal to said first and second loads;
    said second MOS transistor has a gate connected to an output of said second amplifier, and a drain to said first and third switches;
    said second amplifier has a positive terminal connected to a second fixed potential, and a negative terminal to said fifth switch at a first terminal;
    said first and second switches are connected to a first node connected to said fifth switch at a second terminal and to said first load;
    said third and fourth switches are connected to a second node connected to said fifth switch at a third terminal and to said second load;
    said fifth switch has said second terminal connected to said first terminal when said second and third switches turn on; and
    said fifth switch has said third terminal connected to said first terminal when said first and fourth switches turn on.

2. A differential output circuit comprising first and second MOS transistors, first and second amplifiers, first and second loads, and first, second, third, fourth and fifth switches, wherein:
    said first MOS transistor has a gate connected to an output of said first amplifier, and a drain to said second and fourth switches;
    said first amplifier has a negative terminal connected to a first fixed potential, and a positive terminal to said first and second loads;
    said second MOS transistor has a gate connected to an output of said second amplifier, and a drain to said first and third switches;
    said second amplifier has a positive terminal connected to said fifth switch at a first terminal, and a negative terminal to a second fixed potential;
    said first and second switches are connected to a first node connected to said fifth switch at a second terminal and to said first load;
    said third and fourth switches are connected to a second node connected to said fifth switch at a third terminal and to said second load;
    said fifth switch has said second terminal connected to said first terminal when said first and fourth switches turn on; and
    said fifth switch has said third terminal connected to said first terminal when said second and third switches turn on.

3. A differential output circuit comprising first and second MOS transistors, first and second amplifiers, first and second loads, and first, second, third, fourth and fifth switches, wherein:
    said first MOS transistor has a gate connected to an output of said first amplifier, and a drain to said first and third switches;
    said first amplifier has a positive terminal connected to said first and second loads, and a negative terminal to a first fixed potential;
    said second MOS transistor has a gate connected to an output of said second amplifier, and a drain to said second and fourth switches;
    said second amplifier has a positive terminal connected to said fifth switch at a first terminal, and a negative terminal to a second fixed potential;
    said first and second switches are connected to a first node connected to said fifth switch at a second terminal and to said first load;
    said third and fourth switches are connected to a second node connected to said fifth switch at a third terminal and to said second load;
    said fifth switch has said second terminal connected to said first terminal when said second and third switches turn on; and
    said fifth switch has said third terminal connected to said first terminal when said first and fourth switches turn on.

4. A differential output circuit comprising first and second MOS transistors, first and second amplifiers, first and second loads, and first, second, third, fourth and fifth switches, wherein:

said first MOS transistor has a gate connected to an output of said first amplifier, and a drain to said first and third switches;

said first amplifier has a positive terminal connected to said first and second loads, and a negative terminal to a first fixed potential;

said second MOS transistor has a gate connected to an output of said second amplifier, and a drain to said second and fourth switches;

said second amplifier has a positive terminal connected to a second fixed potential, and a negative terminal to said fifth switch at a first terminal;

said first and second switches are connected to a first node connected to said fifth switch at a second terminal and to said first load;

said third and fourth switches are connected to a second node connected to said fifth switch at a third terminal and to said second load;

said fifth switch has said second terminal connected to said first terminal when said first and fourth switches turn on; and said fifth switch has said third terminal connected to said first terminal when said second and third switches turn on.

* * * * *